(12) United States Patent
Kim et al.

(10) Patent No.: US 11,115,754 B2
(45) Date of Patent: Sep. 7, 2021

(54) ACTUATOR

(71) Applicant: EM-TECH Co., Ltd., Gyeongsangnam-do (KR)

(72) Inventors: Cheon Myeong Kim, Gyeongsangnam-do (KR); Jeong Ae Ha, Gyeongsangnam-do (KR); Kyeong Min Lee, Gyeongsangnam-do (KR)

(73) Assignee: EM-TECH. Co., Ltd., Gyeongsangnam-do (KR)

( * ) Notice: Subject to any disclaimer, the term of this patent is extended or adjusted under 35 U.S.C. 154(b) by 0 days.

(21) Appl. No.: 16/683,754

(22) Filed: Nov. 14, 2019

(65) Prior Publication Data
US 2020/0162822 A1 May 21, 2020

(30) Foreign Application Priority Data

Nov. 20, 2018 (KR) .......................... 10-2018-0143849

(51) Int. Cl.
| | |
|---|---|
| *H04R 9/06* | (2006.01) |
| *H05K 5/00* | (2006.01) |
| *H01F 7/126* | (2006.01) |
| *H01F 7/08* | (2006.01) |
| *H04R 1/02* | (2006.01) |
| *H04R 3/00* | (2006.01) |

(Continued)

(52) U.S. Cl.
CPC .............. *H04R 9/06* (2013.01); *H01F 7/081* (2013.01); *H01F 7/126* (2013.01); *H02K 41/0354* (2013.01); *H04R 1/025* (2013.01); *H04R 3/00* (2013.01); *H04R 9/025* (2013.01); *H05K 5/006* (2013.01); *H01F 2007/086* (2013.01)

(58) Field of Classification Search
CPC .......... H04R 9/06; H04R 9/025; H04R 1/025; H04R 3/00; H01F 7/081; H01F 7/126; H01F 2007/086; H02K 41/0354; H05K 5/006; B06B 1/04; B06B 1/045; H01R 12/77; H01R 12/79

See application file for complete search history.

(56) References Cited

U.S. PATENT DOCUMENTS

| | | | |
|---|---|---|---|
| 2011/0018365 A1 | 1/2011 | Kim et al. | |
| 2011/0309691 A1* | 12/2011 | Park ...................... | H02K 33/16 310/25 |

(Continued)

FOREIGN PATENT DOCUMENTS

| | | |
|---|---|---|
| CN | 101141828 A | 3/2008 |
| CN | 102740186 A | 10/2012 |

(Continued)

*Primary Examiner* — Jason R Kurr

(74) *Attorney, Agent, or Firm* — Murphy, Bilak & Homiller, PLLC

(57) ABSTRACT

An actuator is provided that is attached to an electronic device and configured to generate sound and vibration. The actuator includes: a first casing having sidewalls and a bottom; a second casing affixed to the first casing and forming a top; a printed circuit board attached to the first casing and configured to transmit a signal; a voice coil configured to receive the signal from the printed circuit board; and a vibrator configured to vibrate by an electromagnetic force produced through an interaction with the voice coil. The first casing forms a surface that is attached to the electronic device.

5 Claims, 11 Drawing Sheets

(51) Int. Cl.
*H04R 9/02* (2006.01)
*H02K 41/035* (2006.01)

(56) References Cited

U.S. PATENT DOCUMENTS

| | | | | |
|---|---|---|---|---|
| 2014/0152126 A1* | 6/2014 | Kim | ................ | B06B 1/045 |
| | | | | 310/25 |
| 2018/0021812 A1* | 1/2018 | Akanuma | ............ | H02K 33/02 |
| | | | | 310/25 |
| 2019/0014416 A1* | 1/2019 | Kang | ................ | B06B 1/045 |
| 2019/0151896 A1* | 5/2019 | Takahashi | ............ | H04M 1/026 |
| 2020/0001326 A1* | 1/2020 | Takahashi | ............... | G06F 3/01 |

FOREIGN PATENT DOCUMENTS

| | | |
|---|---|---|
| CN | 206524961 U | 9/2017 |
| CN | 107889036 A | 4/2018 |
| JP | 2004104327 A | 4/2004 |
| KR | 20060089454 A | 8/2006 |
| KR | 20150108459 A | 9/2015 |
| KR | 20150140134 A | 12/2015 |
| KR | 20160067344 A | 6/2016 |

* cited by examiner

ACTUATOR

TECHNICAL FIELD

The present invention relates to an actuator that is attached to an electronic device and generates sound and vibration.

BACKGROUND

Flat-panel speakers are used in devices such as mobile phones, personal digital assistants (PDA), personal computers (PC), and more, and generally use a transparent panel (flat) as a vibrating plate, the transparent panel covering a display surface of a display device such as a liquid-crystal display and being placed at a surface of the device.

FIG. 1 illustrates the construction of an example of a flat-panel speaker disclosed in Japanese Laid-Open Patent Application Publication No. 2004-104327. An actuator 10 is fitted to a panel 21, and a peripheral portion of the panel 21 is fixed and held by a frame 22 of a mobile phone, allowing the panel 21 to be placed at a surface of the mobile phone. In this case, a gasket 23 is inserted between the peripheral portion of the panel 21 and the frame 22, around the entire periphery. The panel 21 is held against the frame 22 by means of the gasket 23. In FIG. 1, reference numeral 24 denotes a printed circuit board, and reference numeral 25 denotes lead wires for connecting the actuator 10 to the printed circuit board 24. Although not shown, a display device, e.g., a liquid-crystal display device, is mounted on the printed circuit board 24.

When a voice signal is inputted to the actuator 10 in the flat-panel speaker having the above described construction, piezoelectric vibrating plates 11 and 12 vibrate. The vibrations are transmitted as waves to the panel 21 through a holder 13 to radiate sound through the entire panel 21. The gasket 23 inserted between the panel 21 and the frame 22 can reduce vibrations transmitted to the frame 22 and increase the amplitude of vibration of the panel 21.

FIGS. 2 and 3 are views schematically showing the installation of a sound and vibration generating device using a vibration actuator according to the conventional art. The vibration actuator roughly includes an upper casing 1 whose sidewalls and top are integrated together and a lower casing 2 affixed to the upper casing 1 and forming a bottom. A vibrating body 3 is mounted in the inside space of the upper casing 1 and lower casing 2, and the vibrating body 3 is held by an elastic member 4. The elastic member 4 may be mounted between the upper casing 1 and the vibrating body 3 or between the lower casing 2 and the vibrating body 3.

In this case, a circuit board 5 such as a F-PCB is mounted to the top of the lower casing 2 to transmit an electrical signal to the vibrating body 3. For convenience, the circuit board 5 is mounted to the lower casing 2 which has no sidewalls, because the circuit board 5 has to be pulled out. Also, the bottom of the lower casing 2 usually serves as a stationary surface attached to the device to make it easy to connect the pulled-out circuit board 5 to a substrate of the device.

However, a large amount of vibration force is lost when the lower casing 2 attached to the device transmits the vibration force from the actuator. This is because the lower casing 2 is more severely bent because the lower casing 2 has lower rigidity than the upper casing 1 which has sidewalls, and therefore the vibration force transmitted to the device is lost.

SUMMARY

The present invention provides an actuator that is attached to an electronic device and generates sound and vibration, the actuator comprising: a first casing having sidewalls and a bottom; a second casing affixed to the first casing and forming a top; a printed circuit board attached to the first casing to transmit a signal; a voice coil receiving the signal from the printed circuit board; and a vibrator vibrating by an electromagnetic force produced through an interaction with the voice coil, wherein the first casing is used as a surface that is attached to an electronic device.

In some embodiments, the actuator further comprises an L-shaped auxiliary plate attached to an outer side of the first casing so that the printed circuit board is pulled out and fixed to the electronic device.

In some embodiments, the auxiliary plate is fixed to the first casing by welding, bonding, etc.

In some embodiments, part of a sidewall of the first casing is removed, and the second casing has an extension and an attachment, the extension being formed by bending part of the second casing in an L-shape and attached to where the sidewall of the first casing is removed, and the attachment being attached to the electronic device, wherein the extension of the second casing has a pull-out hole, and the printed circuit board is pulled out through the pull-out hole and fixed to the extension of the second casing.

In some embodiments, a part of a sidewall of the first casing is removed, the first casing having an extension formed by extending the bottom of the sidewall-removed area further outward, and the second casing has an extension formed by bending and extending part of the second casing downward, the extension being attached to where the sidewall of the first casing is removed, wherein the extension of the second casing has a pull-out hole, and the printed circuit board is pulled out through the pull-out hole and fixed to the extension of the first casing and the extension of the second casing.

In some embodiments, an auxiliary supporter with a protrusion for holding the printed circuit board is attached to the bottom of the first casing, and the printed circuit board is pulled out between the first casing and the second casing and attached to the sidewalls of the first casing and the auxiliary supporter.

An actuator provided in the present invention is advantageous in that the first casing having sidewalls with higher rigidity serves as a stationary surface, thus reducing loss of vibration force caused by bending of the casing and transmitting more vibration force the electronic device.

Those skilled in the art will recognize additional features and advantages upon reading the following detailed description, and upon viewing the accompanying drawings.

DETAILED DESCRIPTION

Hereinafter, the present invention will be described in more detail with reference to the drawings.

Figure 1:
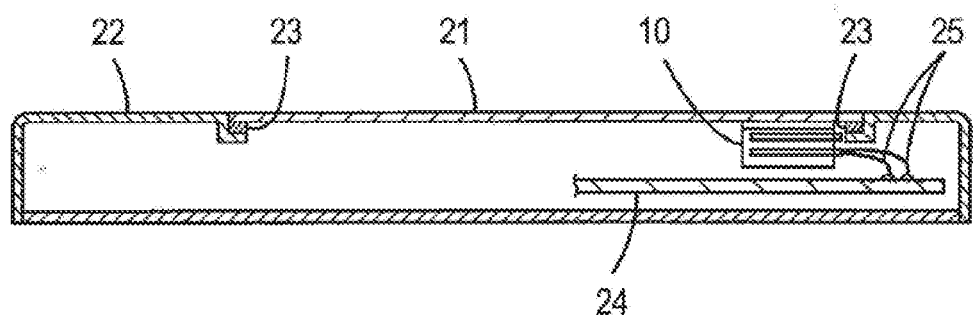
FIG. 1 is a view showing a flat-panel speaker according to the conventional art.
Figure 2:
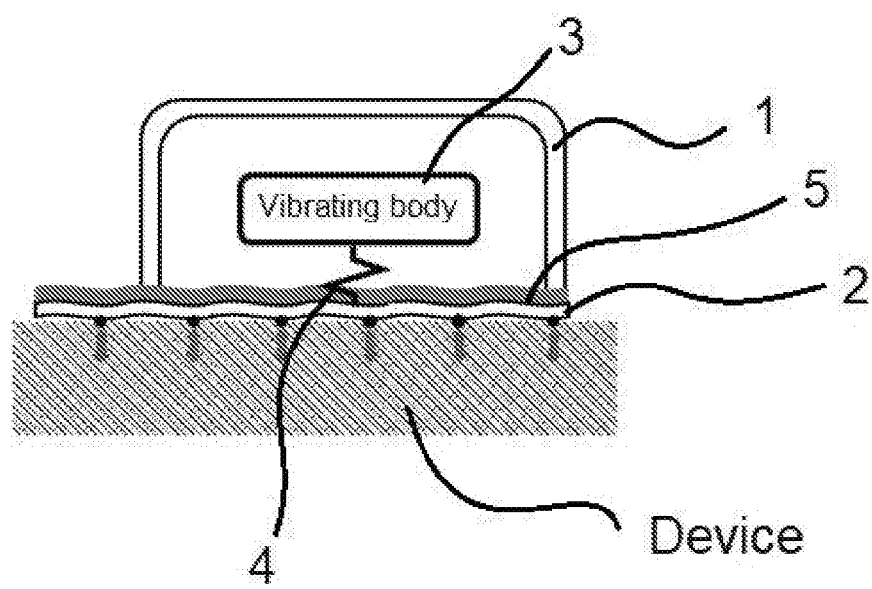
FIG. 2 is a view schematically showing how an actuator according to the conventional art is attached.
Figure 3:
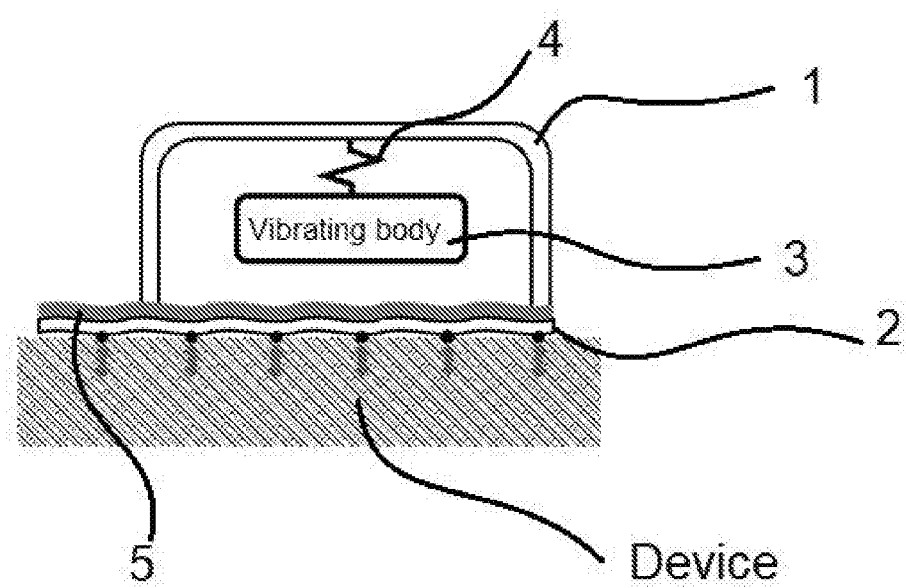
FIG. 3 is a view schematically showing how another actuator according to the conventional art is attached.
Figure 4:
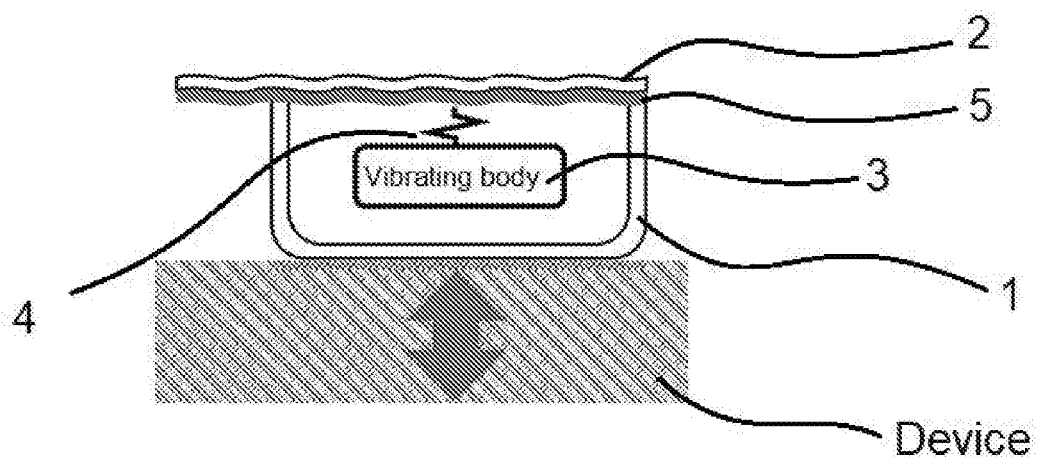
FIG. 4 is a view schematically showing how an actuator according an exemplary embodiment of the present invention is attached.
Figure 5:
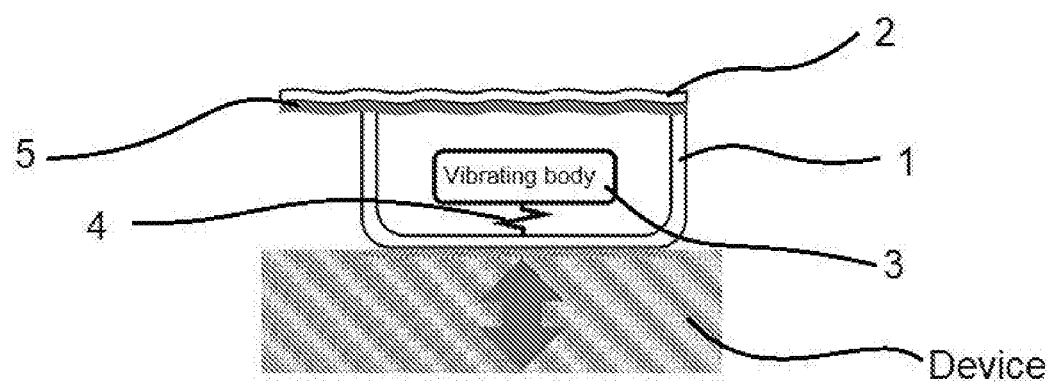
FIG. 5 is a view schematically showing how an actuator according another exemplary embodiment of the present invention is attached.

FIGS. 4 and 5 are views schematically showing the installation of a sound and vibration generating device using a vibration actuator according to the present invention. The vibration actuator roughly includes a first casing 1 whose sidewalls and bottom are integrated together and a second casing 2 affixed to the first casing 1 and forming a top. A vibrating body 3 is mounted in the inside space of the first casing 1 and second casing 2, and the vibrating body 3 is held by an elastic member 4. The elastic member 4 may be mounted between the first casing 1 and the vibrating body 3 or between the second casing 2 and the vibrating body 3.

In the actuator according to the present invention, the bottom of the first casing 1 is a surface that is attached to an electronic device. The first casing 1 has higher rigidity than the second casing 2 since it includes the bottom and sidewalls. Thus, the first casing 1 is less bent when the actuator transmits vibration force to the electronic device through the bottom of the first casing 1, thus reducing loss of vibration force. However, it is difficult to attach a printed circuit board 5 to the first casing 1 and pull it out because the first casing 1 has sidewalls. Due to this, the printed circuit board 5 is attached to the second casing 2 having a planar shape. In this case, when attached to the second casing 2, an end portion of the printed circuit board is not fixed but suspended. This makes it difficult to do soldering on the printed circuit board 5 to connect it to a main circuit of the electronic device, which may lead to a decrease in productivity.

Figure 6:
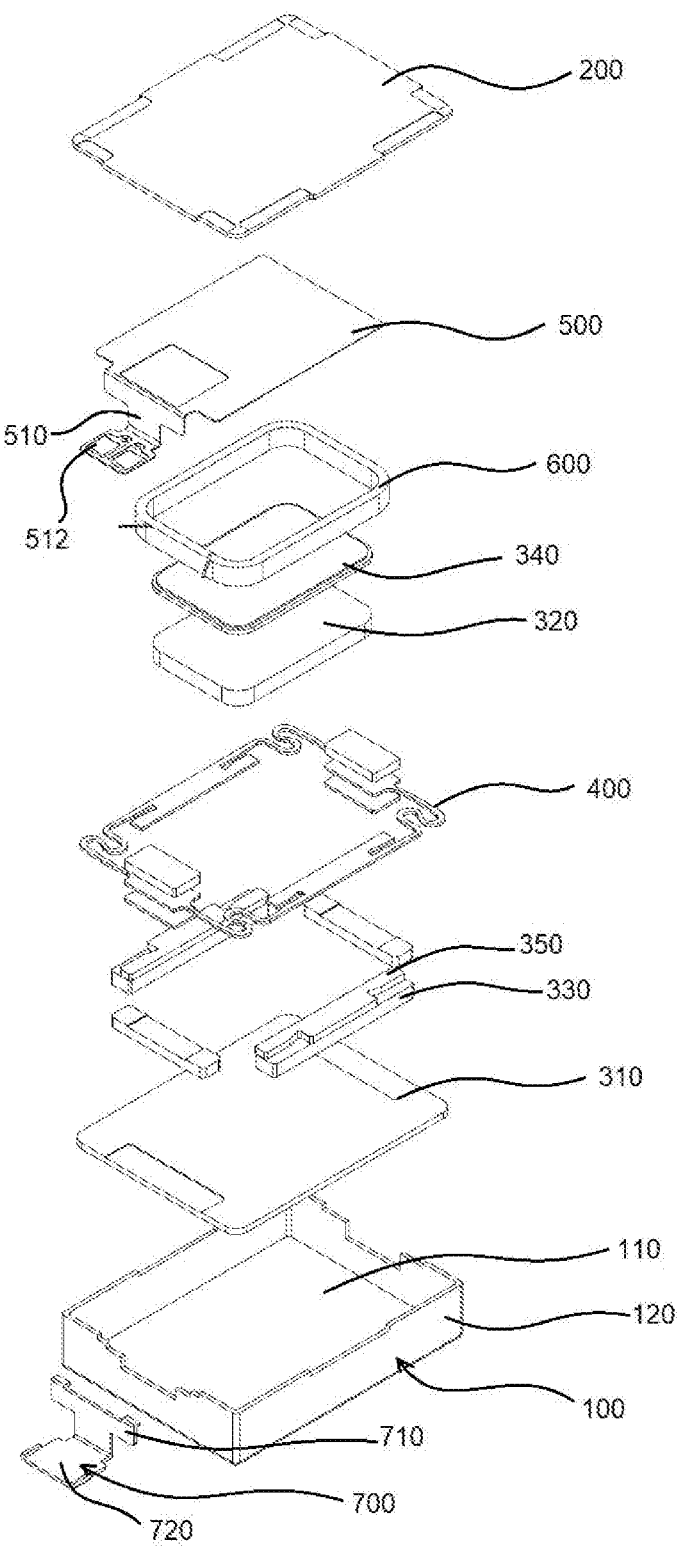
FIG. 6 is an exploded perspective view showing an actuator according to a first exemplary embodiment of the present invention.
Figure 7:
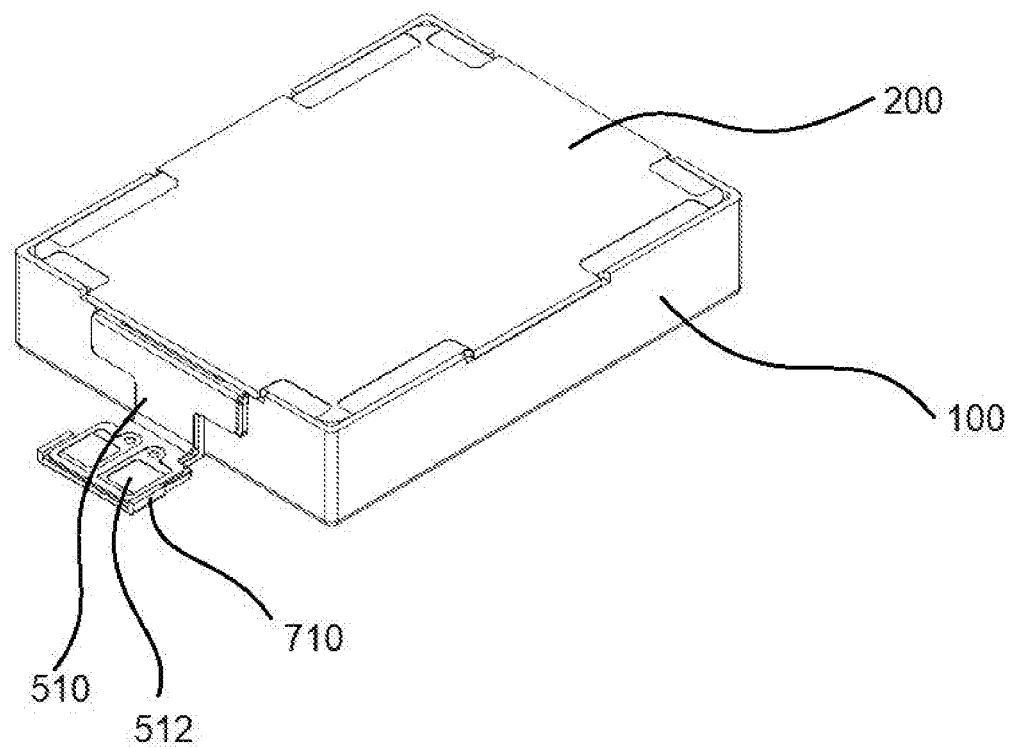
FIG. 7 is a perspective view of the actuator according to the first exemplary embodiment of the present invention.

FIG. 6 is an exploded perspective view showing an actuator according to a first exemplary embodiment of the present invention. FIG. 7 is a perspective view of the actuator according to the first exemplary embodiment of the present invention. The actuator roughly includes a first casing 100 having sidewalls 120 and a bottom 110 and a second casing 200 affixed to the first casing 100 and forming a top. A vibration-generating component is placed within an interior space formed by the first casing 100 and the second casing 200. A vibrating body comprises a yoke 310, a center magnet 320 attached onto the yoke 310, a side magnet 330 placed around the center magnet 320, a center plate 340 attached onto the center magnet 320, and a side plate 350 attached onto the side magnet 330. The vibrating body is supported by an elastic member 400, and the lower end of the elastic member 400 is attached to the vibrating body and the upper end is attached to the bottom of the second casing 200.

A voice coil 600 is placed in a magnetic gap between the center magnet 320 and the side magnet 330, and the voice coil 600 is a stator that is fixed to the second casing 200. In this case, a printed circuit board 500 is attached to the voice coil 600 to transmit an electrical signal. The printed circuit board 500 has an extension 510 that is extended and pulled out of the space formed by the first casing 100 and the second casing 200, and the extension 510 is formed with a land portion 512 where soldering is done to electrically connect it to an external power source.

As explained previously, in the actuator of the present invention, the first casing 100 having the sidewalls 120 and the bottom 110 serves as a surface that is attached to the electronic device, and the printed circuit board 500 is attached to the second casing 200 to make it easy to connect it to the voice coil 600 and attach the printed circuit board 500 to the inside of the casing.

In this case, an L-shaped auxiliary plate 700 is further included to fix and hold the extension 510 of the printed circuit board 500. The L-shaped auxiliary plate 700 is attached to an outer surface of a sidewall 120 of the first casing 100. The auxiliary plate 700 is fixed to the first casing 100 by welding, bonding, etc. The printed circuit board 500 is attached to an inner surface of the second casing 200, and the extension 510 of the printed circuit board 500 is pulled out between the first casing 100 and the second casing 200 and fixed to the L-shaped plate 700. The L-shaped plate 700 comprises a first surface 710 fixed to the sidewall 120 and a second surface 720 bent at a right angle to the first surface 710 and attached to the electronic device. The land portion 512 is positioned on the second surface 720.

Figure 8:
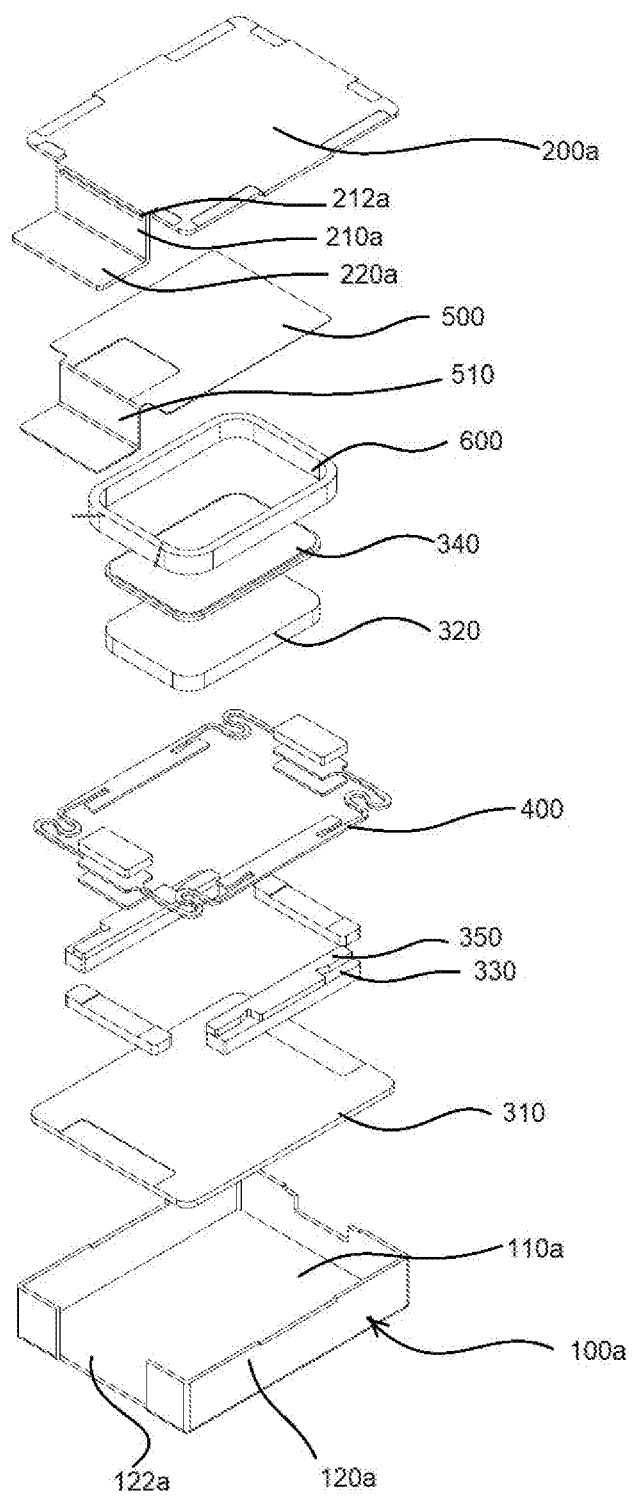
FIG. 8 is an exploded perspective view showing an actuator according to a second exemplary embodiment of the present invention.
Figure 9:
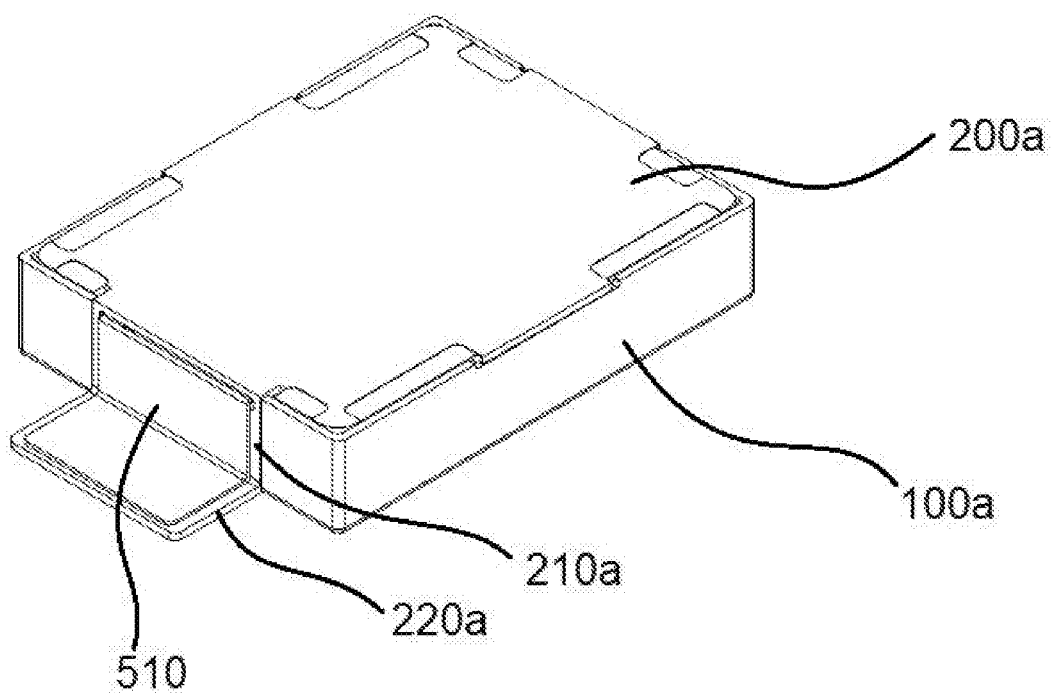
FIG. 9 is a perspective view of the actuator according to the second exemplary embodiment of the present invention.

FIG. 8 is an exploded perspective view showing an actuator according to a second exemplary embodiment of the present invention. FIG. 9 is a perspective view of the actuator according to the second exemplary embodiment of the present invention. The parts mounted in the casings are identical to those of the first exemplary embodiment, except for the shapes of the first casing 100a and second casing 200a, so descriptions thereof will be omitted.

In the actuator according to the second exemplary embodiment of the present invention, part of a sidewall 120a of the first casing 100a is removed. Also, the second casing 200a has an extension 210a attached to a removed area 122a, which is formed by bending part of the second casing 200a. The second casing 200a has an attachment 220a, which is formed by bending and extending the second casing 200a once more at the bottom edge of the second casing 210a. The attachment 220a, together with the first casing 100a, may be attached to the electronic device. Meanwhile, the extension 210a is formed with a pull-out hole 212a for pulling out the extension 510 of the printed circuit board 500. The extension 510 of the printed circuit board 500 may be pulled out through the pull-out hole 212a, thus allowing an external power source or the like to be connected to the extension 510 on the attachment 220a by a method such as soldering.

Figure 10:
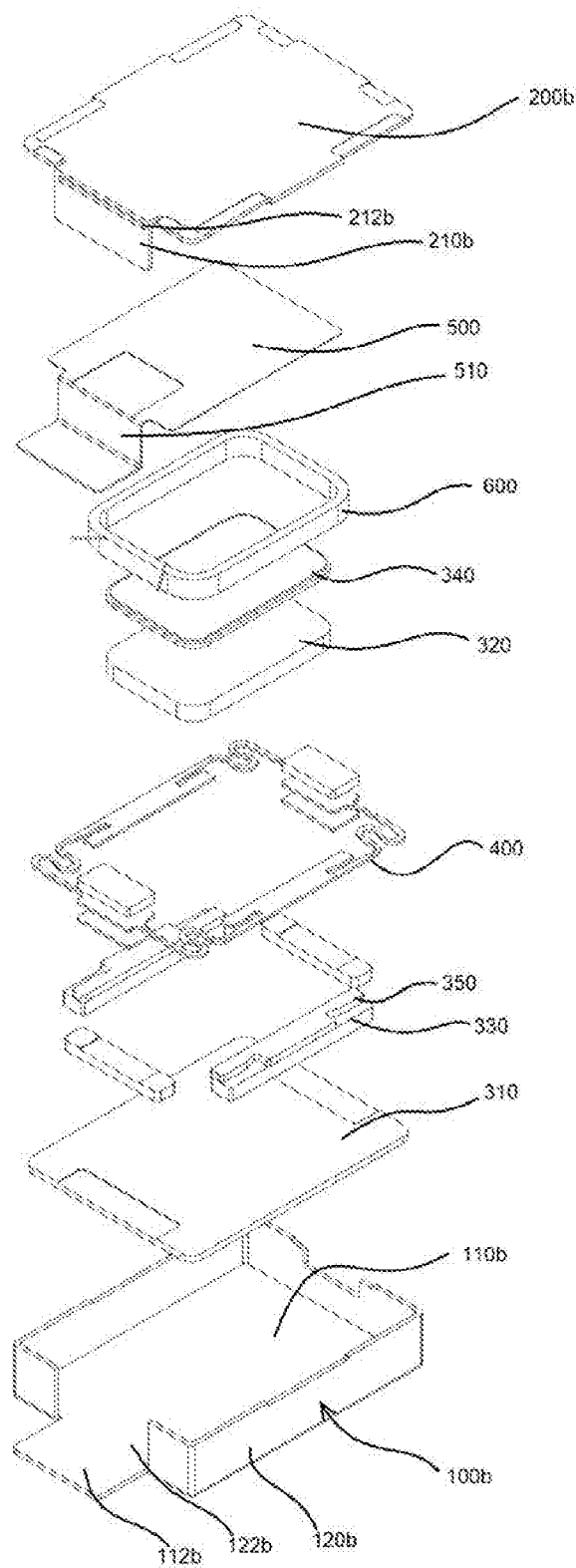
FIG. 10 is an exploded perspective view showing an actuator according to a third exemplary embodiment of the present invention.
Figure 11:
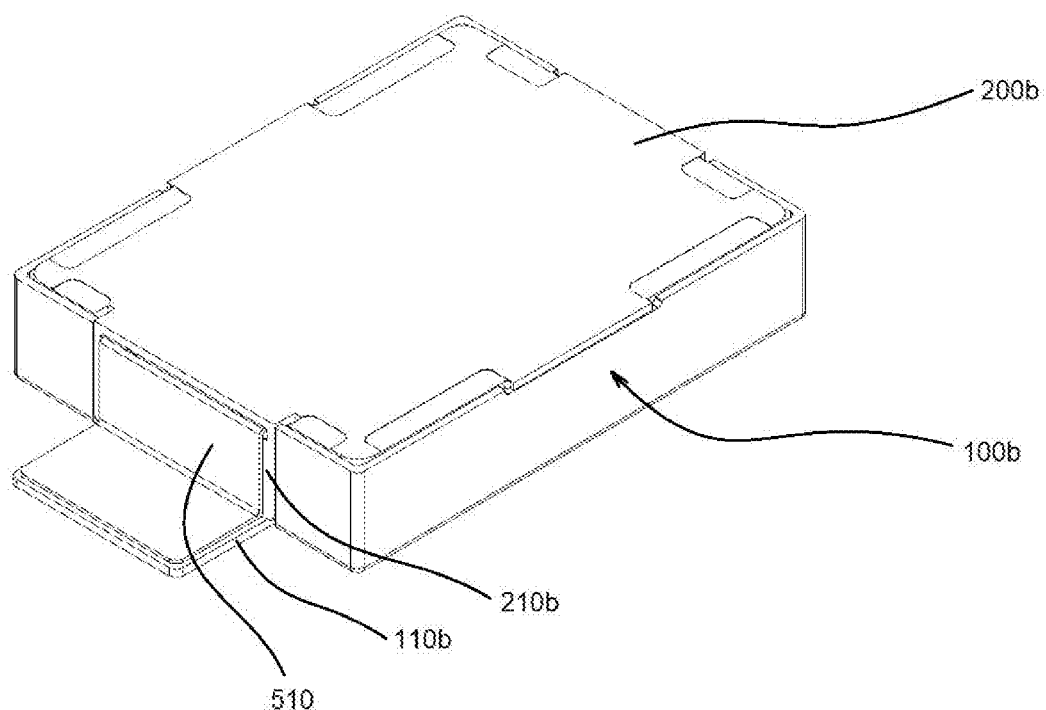
FIG. 11 is a perspective view of the actuator according to the third exemplary embodiment of the present invention.

FIG. 10 is an exploded perspective view showing an actuator according to a third exemplary embodiment of the present invention. FIG. 11 is a perspective view of the actuator according to the third exemplary embodiment of the present invention. The parts mounted in the casings are identical to those of the first exemplary embodiment, except for the shapes of the first casing 100b and second casing 200b, so descriptions thereof will be omitted.

In the actuator according to the third exemplary embodiment of the present invention, part of a sidewall 120b of the first casing 100b is removed. Also, the first casing 110b has an extension 112b which is as wide as a removed area 122b and formed by extending the bottom 110b further outward. Moreover, the second casing 200b has an extension 210b, which is formed by bending and extending part of the second casing 200b downward, and the extension 210b of the second casing 200b is connected to the removed area 122b from which the sidewall 120b is removed. Meanwhile, the extension 210b is formed with a pull-out hole 212b for pulling out the extension 510 of the printed circuit board 500. The extension 510 of the printed circuit board 500 is pulled out through the pull-out hole 212b and attached to the extension 210b of the second casing 200b and the extension 112b of the first casing 100b. On the extension 112b of the first casing 100b, an external power source or the like may be connected to the extension 510 of the printed circuit board 500 by a method such as soldering.

Figure 12:
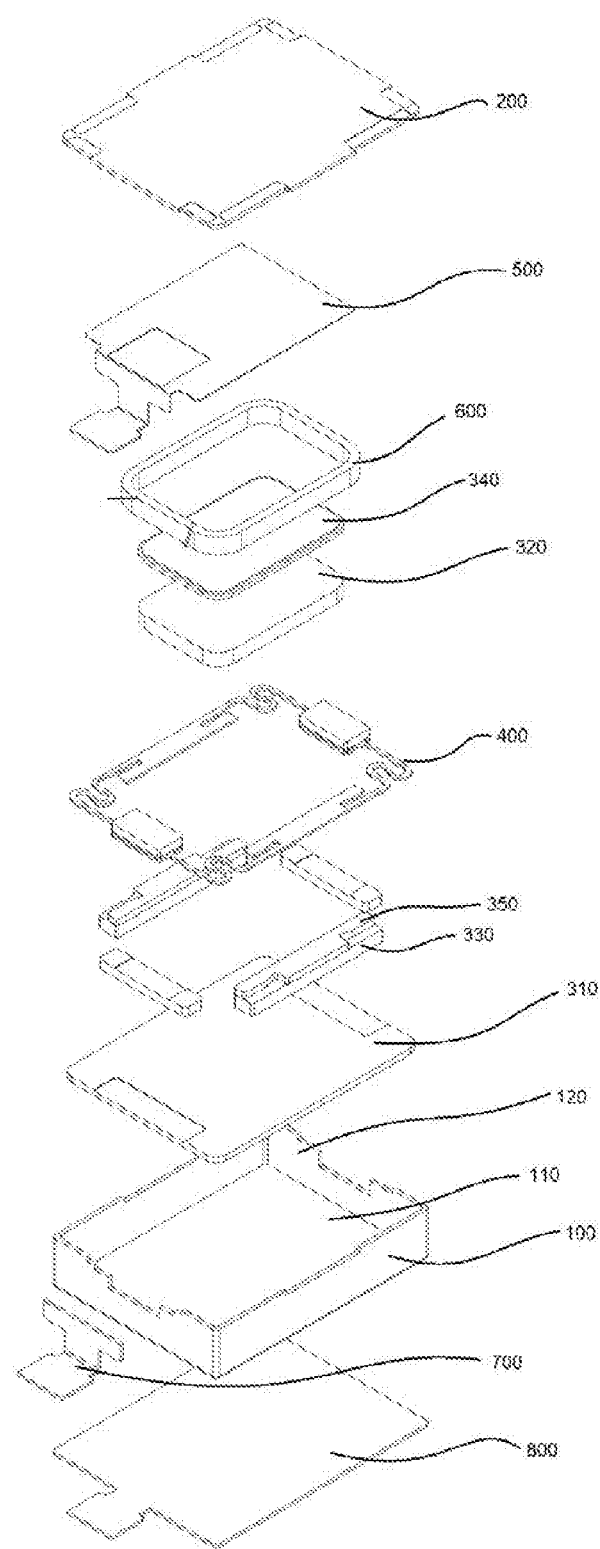
FIG. 12 is an exploded perspective view showing an actuator according to a fourth exemplary embodiment of the present invention.

FIG. 12 is an exploded perspective view showing an actuator according to a fourth exemplary embodiment of the present invention. The parts mounted in the casings are identical to those of the first exemplary embodiment, except for a flat auxiliary plate 800 attached to the bottom of the first casing 100, so descriptions thereof will be omitted.

In the actuator according to the fourth exemplary embodiment of the present invention, an extension 820 is formed at the bottom of the first casing 100, which has the same cross section as the first casing 100 and supports the second surface 720 of the L-shaped auxiliary plate 700.

Figure 13:
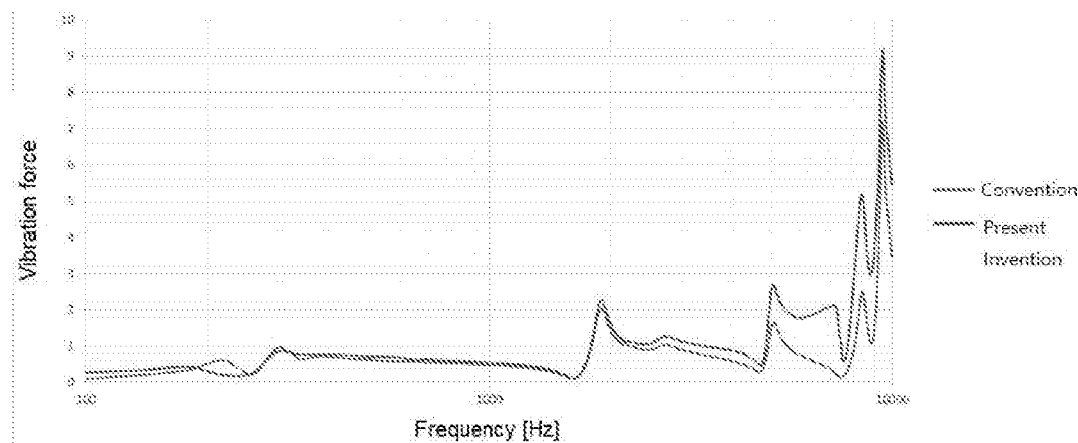
FIG. 13 is a graph comparing the vibration force transmitted by a second casing according to the conventional art attached to an electronic device and the vibration force transmitted by a first casing according to the present invention attached to an electronic device.

FIG. 13 is a graph comparing the vibration force transmitted by a second casing according to the conventional art attached to an electronic device and the vibration force transmitted by a first casing according to the present invention attached to an electronic device. As shown in the graph, it is evident that the transmission of vibration force through the first casing with sidewalls is better, especially at high frequencies, compared to the transmission of vibration force through the second casing.

Figure 14:
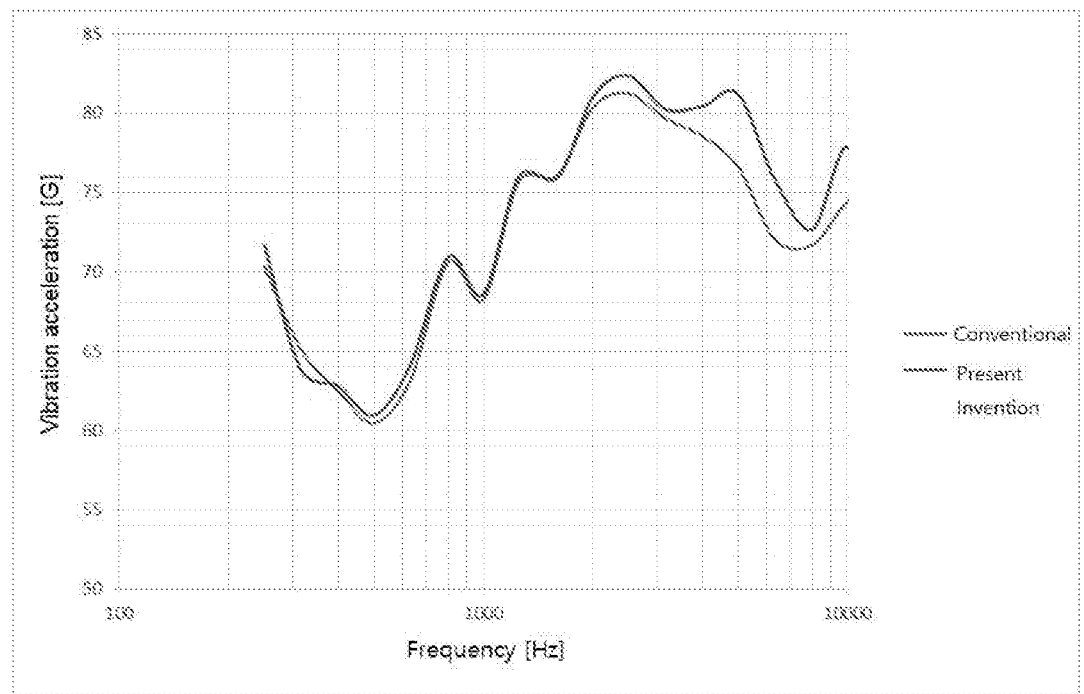
FIG. 14 is a graph comparing the vibration acceleration according to the conventional art and the vibration acceleration according to the present invention.

FIG. 14 is a graph comparing the vibration acceleration according to the conventional art and the vibration acceleration according to the present invention. As shown in the graph, it is evident that the transmission of vibration force through the first casing causes less distortion in vibration and improves the efficiency of transmission of vibration force, thereby leading to better sound pressure compared to the conventional attachment method.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An actuator that is attached to an electronic device and configured to generate sound and vibration, the actuator comprising:
a first casing having sidewalls and a bottom, wherein a part of a sidewall of the first casing is removed;
a second casing affixed to the first casing and forming a top;
a printed circuit board attached to the second casing and configured to transmit a signal, wherein the printed circuit board comprises an extension that is extended and pulled out of a space formed by the first casing and the second casing and through the removed part of the sidewall of the first casing, and a land portion configured for an electrical connection with an external power source;
a voice coil configured to receive the signal from the printed circuit board;
an L-shaped auxiliary plate attached to an outer side of the first casing so that the printed circuit board is pulled out and fixed to the electronic device; and
a vibrator configured to vibrate by an electromagnetic force produced through an interaction with the voice coil,
wherein the first casing has a higher rigidity than the second casing since the first casing has the sidewalls and the bottom as one body that forms a surface that is attached to the electronic device,
wherein the extension is pulled out through the removed part of the sidewall of the first casing and is fixed to the L-shaped auxiliary plate.

2. The actuator of claim 1, wherein the L-shaped auxiliary plate is fixed to the first casing.

3. An actuator that is attached to an electronic device and configured to generate sound and vibration, the actuator comprising:
a first casing having sidewalls and a bottom, wherein a part of a sidewall of the first casing is removed;
a second casing affixed to the first casing and forming a top;
a printed circuit board attached to the second casing and configured to transmit a signal, wherein the printed circuit board comprises an extension that is extended and pulled out of a space formed by the first casing and the second casing and through the removed part of the sidewall of the first casing, and a land portion configured for an electrical connection with an external power source;
a voice coil configured to receive the signal from the printed circuit board; and
a vibrator configured to vibrate by an electromagnetic force produced through an interaction with the voice coil,
wherein the first casing has a higher rigidity than the second casing since the first casing has the sidewalls and the bottom as one body that forms a surface that is attached to the electronic device,
wherein the second casing further has an extension and an attachment,
wherein the extension of the second casing is formed by bending a part of the second casing in an L-shape and attached to where the sidewall of the first casing is removed,
wherein the attachment is attached to the electronic device,
wherein the extension of the second casing has a pull-out hole,
wherein the extension of the printed circuit board is pulled out through the pull-out hole and fixed to the extension of the second casing.

4. An actuator that is attached to an electronic device and configured to generate sound and vibration, the actuator comprising:
- a first casing having sidewalls and a bottom, wherein a part of a sidewall of the first casing is removed;
- a second casing affixed to the first casing and forming a top;
- a printed circuit board attached to the second casing and configured to transmit a signal, wherein the printed circuit board comprises an extension that is extended and pulled out of a space formed by the first casing and the second casing and through the removed part of the sidewall of the first casing, and a land portion configured for an electrical connection with an external power source;
- a voice coil configured to receive the signal from the printed circuit board; and
- a vibrator configured to vibrate by an electromagnetic force produced through an interaction with the voice coil,
- wherein the first casing has a higher rigidity than the second casing since the first casing has the sidewalls and the bottom as one body that forms a surface that is attached to the electronic device,
- wherein the first casing further has an extension formed by extending a bottom of the sidewall-removed area further outward,
- wherein the second casing further has an extension formed by bending and extending a part of the second casing downward,
- wherein the extension of the second casing is attached to where the sidewall of the first casing is removed,
- wherein the extension of the second casing has a pull-out hole,
- wherein the extension of the printed circuit board is pulled out through the pull-out hole and fixed to the extension of the first casing and the extension of the second casing.

5. An actuator that is attached to an electronic device and configured to generate sound and vibration, the actuator comprising:
- a first casing having sidewalls and a bottom, wherein a part of a sidewall of the first casing is removed;
- a second casing affixed to the first casing and forming a top;
- a printed circuit board attached to the second casing and configured to transmit a signal, wherein the printed circuit board comprises an extension that is extended and pulled out of a space formed by the first casing and the second casing and through the removed part of the sidewall of the first casing, and a land portion configured for an electrical connection with an external power source;
- a voice coil configured to receive the signal from the printed circuit board;
- a vibrator configured to vibrate by an electromagnetic force produced through an interaction with the voice coil; and
- an auxiliary supporter with a protrusion for holding the extension of the printed circuit board that is attached to the bottom of the first casing,
- wherein the first casing has a higher rigidity than the second casing since the first casing has the sidewalls and the bottom as one body that forms a surface that is attached to the electronic device,
- wherein the extension of the printed circuit board is pulled out between the first casing and the second casing and attached to the sidewalls of the first casing and the auxiliary supporter.

\* \* \* \* \*